United States Patent
Chwu et al.

(10) Patent No.: US 8,298,431 B2
(45) Date of Patent: Oct. 30, 2012

(54) MANUFACTURING METHOD OF FLEXIBLE DISPLAY PANEL AND MANUFACTURING METHOD OF ELECTRO-OPTICAL APPARATUS

(75) Inventors: Jong-Wen Chwu, Taipei County (TW); Chao-Cheng Lin, Keelung (TW); Che-Yao Wu, Changhua County (TW); Yu-Chen Liu, Taipei (TW); Wei-Chieh Yang, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 995 days.

(21) Appl. No.: 12/330,491

(22) Filed: Dec. 8, 2008

(65) Prior Publication Data

US 2010/0053721 A1   Mar. 4, 2010

(30) Foreign Application Priority Data

Aug. 28, 2008  (TW) ............................... 97132996 A

(51) Int. Cl.
*B44C 1/22* (2006.01)
(52) U.S. Cl. ................ 216/23; 216/24; 216/33; 216/58; 216/72; 216/80; 216/83; 216/97
(58) Field of Classification Search ............. None
See application file for complete search history.

(56) References Cited

U.S. PATENT DOCUMENTS

| | | | | |
|---|---|---|---|---|
| 3,959,045 | A | * | 5/1976 | Antypas .......................... 438/20 |
| 5,395,481 | A | * | 3/1995 | McCarthy ..................... 438/479 |
| 5,455,202 | A | * | 10/1995 | Malloy et al. ................. 438/118 |
| 7,361,519 | B2 | | 4/2008 | Yamazaki et al. |
| 7,768,193 | B2 | * | 8/2010 | Tsutsui et al. ................ 313/503 |
| 2004/0142118 | A1 | | 7/2004 | Takechi |
| 2004/0232459 | A1 | * | 11/2004 | Takayama et al. ............ 257/295 |
| 2005/0151197 | A1 | | 7/2005 | Takechi |
| 2007/0072323 | A1 | | 3/2007 | Kim |
| 2008/0110862 | A1 | | 5/2008 | Kim et al. |
| 2009/0213314 | A1 | * | 8/2009 | Azuma et al. ................. 349/122 |
| 2009/0258565 | A1 | * | 10/2009 | Chwu et al. .................... 445/25 |

FOREIGN PATENT DOCUMENTS

| | | |
|---|---|---|
| JP | 2004-219551 | 8/2004 |
| TW | I242176 | 10/2005 |
| TW | 200714953 | 4/2007 |
| TW | 200827822 | 7/2008 |

OTHER PUBLICATIONS

"Office Action of Taiwan Counterpart Application", issued on Aug. 29, 2012, p1-p5, in which the listed references were cited.

* cited by examiner

*Primary Examiner* — Anita Alanko
(74) *Attorney, Agent, or Firm* — Jianq Chyun IP Office

(57) ABSTRACT

A first etching stop layer and an active layer are formed on an inner surface of a first glass substrate, and a second etching stop layer and a cover layer are formed on an inner surface of a second glass substrate. A display media is formed between the first glass substrate and the second glass substrate. A first passivation layer is formed on an outer surface of the second glass substrate. A first etching process is performed to expose the first etching stop layer. A first flexible substrate is formed on the exposed first etching stop layer, and a second passivation layer is formed on the first flexible substrate. The first passivation layer is removed. A second etching process is performed to expose the second etching stop layer. A second flexible substrate is formed on the exposed second etching stop layer, and the second passivation layer is removed.

10 Claims, 9 Drawing Sheets

MANUFACTURING METHOD OF FLEXIBLE DISPLAY PANEL AND MANUFACTURING METHOD OF ELECTRO-OPTICAL APPARATUS

CROSS-REFERENCE TO RELATED APPLICATION

This application claims the priority benefit of Taiwan application serial no. 97132996, filed on Aug. 28, 2008. The entirety of the above-mentioned patent application is hereby incorporated by reference herein and made a part of this specification.

BACKGROUND OF THE INVENTION

1. Field of the Invention

The present invention relates to a display panel and a fabricating method thereof, and an electro-optical device and a fabricating method thereof. More particularly, the present invention relates to a flexible display panel and a fabricating method thereof, and an electro-optical device and a fabricating method thereof.

2. Description of Related Art

With development of technology, techniques for display devices are developed accordingly, and flat panel displays (FPD) having features of lightness, slimness, shortness, and smallness gradually substitute conventional thick cathode ray tube (CRT) displays. Different types of the FPD such as a liquid crystal display (LCD), a plasma display panel (PDP), an electro luminescent display (ELD), and a vacuum fluorescent display (VFD) generally include glass substrates. Since a whole weight of the FPD is determined by weight of the glass substrates, the weight and thickness of the glass substrates are managed to be reduced to obtain the FPD having a relative lightweight and thin thickness.

FIG. 1A to FIG. 1C are cross-sectional views illustrating a conventional method of fabricating a display panel. Referring to FIG. 1A, the method of fabricating the conventional display panel 1 can be described as follows. First, a first glass substrate 10 and a second glass substrate 20 are provided, and a thin film transistor layer 12 is formed on an inner surface 10a of the first glass substrate 10, and a color filter layer 22 is formed on an inner surface 20a of the second glass substrate 20. Referring to FIG. 1B, a liquid crystal layer 30 is formed between the first glass substrate 10 and the second glass substrate 20 and the first glass substrate 10 and the second glass substrate 20 are assembled. Referring to FIG. 1C, the first glass substrate 10 and the second glass substrate 20 are thinned to form a first thinned glass substrate 10' and a second thinned glass substrate 20'.

The glass substrates are thinned must based on both of a grinding and a polishing process for reducing the weight and thickness of the glass substrates, so that a light and thin display panel 1 can be applied to a display device (not shown). The thickness of the first glass substrate 10 and the second glass substrate 20 before the thinning is about 0.5 mm, so that the first glass substrate 10 and the second glass substrate 20 with the relatively great thickness have adequate compressive strengths. However, to cope with a light and thin trend of the displays, the original thickness of the glass substrates are reduced, so that the thickness of the first glass substrate 10 and the second glass substrate 20 is thinned from 0.5 mm to 0.3 mm. Now, the thinned glass substrates are liable to be cracked due to inadequate compressive strengths thereof. Moreover, the first glass substrate 10 and the second glass substrate 20 are rigid substrates, so that but first thinned glass substrate 10' and the second thinned glass substrate 20' can reduce the whole weight and thickness of the display device, the display device still cannot be bended to tolerate a specific degree of deformation, and accordingly popularity of the display is influenced.

SUMMARY OF THE INVENTION

The present invention is directed to a flexible display panel, in which a conventional glass substrate is substituted by a flexible substrate, so that a display applying the flexible display panel is bendable, and may have a light and slim appearance.

The present invention is directed to a method for fabricating a flexible display panel, by which the aforementioned flexible display panel can be fabricated.

The present invention is directed to an electro-optical device having the aforementioned flexible display panel, which has a relatively light and slim appearance.

The present invention is directed to a method for fabricating the aforementioned electro-optical device.

The present invention provides a method for fabricating a flexible display panel. First, a first glass substrate and a second glass substrate are provided. Next, a first etching stop layer and an active layer are sequentially formed on an inner surface of the first glass substrate, and a second etching stop layer and a cover layer are sequentially formed on an inner surface of the second glass substrate. Next, a display media is formed between the first glass substrate and the second glass substrate and the first glass substrate and the second glass substrate are assembled. Next, a first passivation layer is formed on an outer surface of the second glass substrate. Next, a first etching process is performed to totally remove the first glass substrate and expose the first etching stop layer. Next, a first flexible substrate is formed on the exposed first etching stop layer, and a second passivation layer is formed on the first flexible substrate. Next, the first passivation layer on the outer surface of the second glass substrate is removed. Next, a second etching process is performed to totally remove the second glass substrate and expose the second etching stop layer. Finally, a second flexible substrate is formed on the exposed second etching stop layer, and the second passivation layer on the first flexible substrate is removed.

The present invention provides a flexible display panel including a first flexible substrate, a second flexible substrate and a display media. A first etching stop layer and an active layer are disposed on the first flexible substrate, wherein the material of the first etching stop layer includes polyamide or silicon-rich dielectric material. A second etching stop layer and a cover layer are disposed on the second flexible substrate, wherein the material of the second etching stop layer includes polyamide or silicon-rich dielectric material. The display media is disposed between the first flexible substrate and the second flexible substrate.

The present invention provides a method for fabricating an electro-optical device, which includes the aforementioned method for fabricating the flexible display panel.

The present invention provides an electro-optical device including the aforementioned flexible display panel.

In the present invention, since the flexible substrates are applied to serve as the substrates of the flexible display panel, compared to the conventional display panel applying rigid glass substrates, the flexible display panel of the present invention can be bended to tolerate a specific degree of deformation, and a display applying such display panel may have a light and slim appearance. Moreover, the present invention also provides the aforementioned method for fabricating the flexible display panel, and the electro-optical device applying the flexible display panel can also be bended, and has the light and slim appearance.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 2:
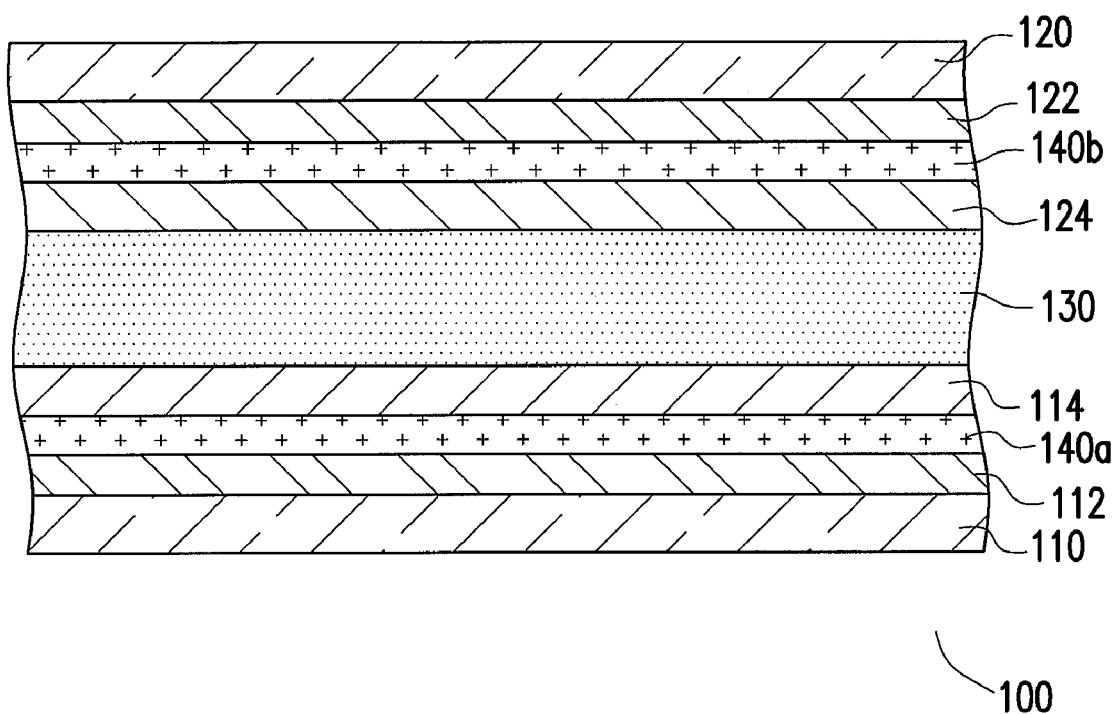
FIG. 2 is a cross-sectional view of a flexible display panel according to an embodiment of the present invention.

FIG. 2 is a cross-sectional view of a flexible display panel according to an embodiment of the present invention. Referring to FIG. 2, in the present embodiment, the flexible display panel 100 includes a first flexible substrate 110, a second flexible substrate 120 and a display media 130, wherein the display media 130 is disposed between the first flexible substrate 110 and the second flexible substrate 120.

In detail, a first etching stop layer 112 and an active layer 114 is disposed on the first flexible substrate 110, and a second etching stop layer 122 and a cover layer 124 are disposed on the second flexible substrate 120. Particularly, the first etching stop layer 112 is disposed between the active layer 114 and the first flexible substrate 110, and the second etching stop layer 122 is disposed between the cover layer 124 and the second flexible substrate 120. Moreover, the display media 130 is disposed between the active layer 114 of the first flexible substrate 110 and the cover layer 124 of the second flexible substrate 120.

In the present embodiment, the first flexible substrate 110 and the second flexible substrate 120 include plastic substrates, metal substrate, glass having curvatures, or combinations thereof, so that the flexible display panel 100 can tolerate a specific degree of deformation. It should be noted that if the metal substrate is utilized, since the metal substrate is opaque, only one of the first flexible substrate 110 and the second flexible substrate 120 of the flexible display panel 100 can be the metal substrate. Namely, one of the first flexible substrate 110 and the second flexible substrate 120 has to be a transparent substrate (such as the plastic substrate, the glass having curvature or a combination thereof), so that light can passes through the flexible display panel 100. Moreover, in other embodiments, at least one of the first flexible substrate 110 and the second flexible substrate 120 has to have functions of polarization, phase difference, brightness enhancement, light delay, or at least two of the aforementioned functions. In other words, the first flexible substrate 110 and the second flexible substrate 120 not only have transparent and bendable features, but also have functions of a general polarizer, a phase plate, a light delay film, and/or a brightness enhancement film, etc., and allocation of an extra polarizer, phase plate and/or brightness enhancement film is unnecessary.

Moreover, the active layer 114 on the first flexible substrate 100 has a plurality of scan lines (not shown), a plurality of data lines (not shown), a plurality of thin film transistors (not shown), and a plurality of pixel electrodes (not shown). The thin film transistors are electrically connected to the corresponding scan lines and data lines, and the pixel electrodes are electrically connected to the corresponding thin film transistors. Moreover, the type of the thin film transistor includes a bottom gate type, a top gate type or other type, and the doping type of the thin film transistor include N-type, P-type, or a combination thereof.

Moreover, a structure of the first etching stop layer 112 disposed between the active layer 114 and the first flexible substrate 110 is a single layer structure or a multi layer structure, and the material thereof includes polyamide or silicon-rich dielectric material. In the present embodiment, the silicon-rich dielectric material is preferably silicon-rich silicon nitride (SixNy), and the so called silicon-rich SixNy refers to that a proportion between silicon atoms and nitride atoms of the SixNy is substantially 1-1.25, but the present invention is not limited thereto, and the proportion between silicon atoms and nitride atoms of the SixNy is substantially greater than or equal to 1. In other embodiments, the silicon-rich dielectric material can be silicon-rich silicon oxide, silicon-rich silicon oxynitride, silicon-rich silicon carbide, silicon-rich silicon germanium, silicon-rich silicon arsenic, or other suitable materials, and definition of the silicon-rich is substantially the same to that of the silicon-rich silicon nitride.

Moreover, material of the cover layer 124 on the second flexible substrate 120 is determined according to the material of the display media 130. If the material of the display media 130 is a photoelectric deflection material such as liquid crystal material or other suitable materials, the material of the cover layer 124 then can be a common electrode layer (not shown), a color filter layer (not shown), a planarization layer (not shown), an alignment layer (not shown), or at least two of the aforementioned layers. For example, if the cover layer 124 has four material layers such as the common electrode layer, the planarization layer, the alignment layer, and the color filter layer, a disposing method thereof can be described as follows. The planarization layer is disposed between the color filter layer and the common electrode layer, and the alignment layer covers the common electrode layer, wherein the alignment layer can arrange liquid crystal molecules along a specific direction. Alternatively, the planarization layer is disposed between the color filter layer and the common electrode layer, and the alignment layer covers the color filter layer, wherein the alignment layer can arrange liquid crystal molecules along a specific direction. If the cover layer 124 has three material layers such as the common electrode layer, the alignment layer and the color filter layer, a disposing method thereof can be described as follows. The common electrode layer is disposed between the color filter layer and the alignment layer, and the alignment layer covers the common electrode layer, wherein the alignment layer can arrange liquid crystal molecules along a specific direction. Alternatively, the color filter layer is disposed between the common electrode layer and the alignment layer, and the alignment layer covers the color filter layer, wherein the alignment layer can arrange liquid crystal molecules along a specific direction. If the cover layer 124 has other three material layers such as the alignment layer, the common electrode layer and the planarization layer, a disposing method thereof can be described as follows. The common electrode layer is disposed between the alignment layer and the planarization layer, and the alignment layer covers the common electrode layer, wherein the alignment layer can arrange liquid crystal molecules along a specific direction, and now the color light required for displaying color images can be provided by a light source (not shown) or the color filter layer (not shown) can be disposed on the first flexible substrate 110. If the cover layer 124 has two material layers such as the common electrode layer and the alignment layer, the disposing method is that the alignment layer covers the common electrode layer, wherein the alignment layer can arrange liquid crystal molecules along a specific direction, and now the color light required for displaying color images can be provided by the light source or the color filter layer (not shown) can be disposed on the first flexible substrate 110. If the cover layer 124 has other two material layers such as the common electrode layer and the color filter layer, the disposing method is that the color filter layer then covers the common electrode layer, or the common electrode layer covers the color filter layer. If the cover layer 124 has still other two material layers such as the planarization layer and the alignment layer, the disposing method is that the alignment layer covers the planarization layer, wherein the alignment layer can arrange liquid crystal molecules along a specific direction, and now the color light required for displaying color images can be provided by the light source or the color filter layer can be disposed on the first flexible substrate 110. If the cover layer 124 has further other two material layers such as the planarization layer and the common electrode layer, the disposing method is that the common electrode layer covers the planarization layer, and now the color light required for displaying color images can be provided by the light source or the color filter layer can be disposed on the first flexible substrate 110, alternatively, the planarization layer covers the common electrode layer, and now the color light required for displaying color images can be provided by the light source or the color filter layer can be disposed on the first flexible substrate 110. In case the cover layer has only one material layer, description of the disposing method is then omitted. Moreover, material of the common electrode layer is for example indium tin oxide (ITO), indium zinc oxide (IZO), indium tin zinc oxide, hafnium oxide, zinc oxide, aluminium oxide, aluminium tin oxide, aluminium zinc oxide, cadmium tin oxide, cadmium zinc oxide, or combinations thereof, but the present invention is not limited thereof. Material of the planarization layer can be an inorganic material (such as silicon oxide, nitride oxide, silicon oxynitride, silicon carbide, hafnium oxide, aluminium oxide, or other materials, or combinations thereof), organic material (such as photoresist, benzocyclobutene, cycloalkenes, polyimide, polyamide, polyester, polyol, oxypropylene, polystyrene, resin, polyether, polyketides, or other materials, or combinations thereof), or a combination thereof. In other embodiments, if the display media 130 is a self-luminescent material, for example, an electroluminescent material, the cover layer 124 can also be a dry layer, an oxygen-water blocking layer or an oxygen-water absorbing layer.

Similarly, the second etching stop layer 122 disposed between the cover layer 124 and the second flexible substrate 120 is a single layer structure or a multi layer structure, and the material thereof includes polyamide or silicon-rich dielectric material. In the present embodiment, the silicon-rich dielectric material is preferably the silicon-rich silicon nitride (SixNy), but the present invention is not limited thereto, and the so called silicon-rich SixNy refers to that a proportion between silicon atoms and nitride atoms of the SixNy is substantially 1-1.25, but the present invention is not limited thereto. Namely, the proportion between silicon atoms and nitride atoms of the SixNy is substantially greater than or equal to 1. In other embodiments, the silicon-rich dielectric material can be silicon-rich silicon oxide, silicon-rich silicon oxynitride, silicon-rich silicon carbide, silicon-rich silicon germanium, silicon-rich silicon arsenic, or other suitable materials, and definition of the silicon-rich is substantially the same to that of the silicon-rich silicon nitride. Moreover, in the present embodiment, preferably, the material of the first etching stop layer 112 is substantially the same to the material of the second etching stop layer 122, but the present invention is not limited thereto, and in other embodiments, the material of the first etching stop layer 112 is substantially different to the material of the second etching stop layer 122.

Moreover, the material of the display media includes liquid crystal material, electroluminescent material, or a combination thereof. If the display media 130 of the flexible display panel 100 is the liquid crystal, the flexible display panel 100 is referred to as liquid crystal display (LCD) panel (such as a trasmissive display panel, a transflective display panel, a reflective display panel, a color filter on array display panel (COA), an array on color filter display panel (AOC), a vertical alignment (VA) display panel, an in-plane switching (IPS) display panel, a multi-domain vertical alignment (MVA), a twist nematic (TN) display panel, a super twist nematic (STN) display panel, a patterned-silt vertical alignment (PVA) display panel, a super patterned-silt vertical alignment (S-PVA) display panel, an advance super view (ASV) display panel, a fringe field switching (FFS) display panel, a continuous pinwheel alignment (CPA) display panel, an axially symmetric aligned micro-cell mode (ASM) display panel, an optical compensation banded (OCB) display panel, a super in plane switching (S-IPS) display panel, an advanced super in plane switching (AS-IPS) display panel, an ultra-fringe field switching (UFFS) display panel, a polymer stabilized alignment (PSA) display panel, a dual-view display panel, a double screen display panel, a triple screen display panel, a triple-view display panel, a three-dimensional (3D) display panel, a electrowetting display panel, or other types of display panels, or combinations thereof), which is also referred to as non-self-luminescent display panels. If the material of the display media 130 is the electroluminescent material, the flexible display panel 100 is then referred as an electroluminescent display panel (for example, a phosphorescence electroluminescent display panel, a fluorescent electroluminescent display panel or a combination thereof), which is also referred to as a self-luminescent display panel, and the electroluminescent material can be organic materials, inorganic materials, or a combination thereof. Moreover, molecules of the aforementioned materials include small molecules, polymer, or a combination thereof. If the display media 130 simultaneously includes the liquid crystal and the electroluminescent material, the flexible display panel 100 is then referred to as a hybrid display panel or a semi self-luminescent display panel.

Moreover, in the flexible display panel 100 of the present embodiment, preferably, adhesive layers 140a and 140b are respectively disposed between the first etching stop layer 112 and the active layer 114 and between the second etching stop layer 122 and the cover layer 124 for enhancing an adhesion between the first etching stop layer 112 and the active layer 114, enhancing an adhesion between the second etching stop layer 122 and the cover layer 124, and reducing a stress between the active layer 114 and the first etching stop layer 112. The material of the adhesive layers 140a and 140b is a single-layer or a multi-layer dielectric material, and in the present embodiment, the silicon oxide and/or silicon oxynitride of the inorganic dielectric material is taken as an example, butt the present invention is not limited thereto, and other inorganic materials such as the material of the planarization layer, the organic dielectric materials such as the material of the planarization layer, or combinations of the inorganic materials, or combinations of the organic materials, or combinations thereof can also be applied. It should be noted that in another embodiment which is not illustrated, in the flexible display panel 100, the adhesive layer can be selectively disposed at least one of between the first etching stoop layer 112 and the active layer 114 and between the second etching stop layer 122 and the cover layer 124, or none adhesive layer is disposed between the first etching stoop layer 112 and the active layer 114, or none adhesive layer is disposed between the second etching stop layer 122 and the cover layer 124, which are all within the scope of the present invention.

Figure 1A:
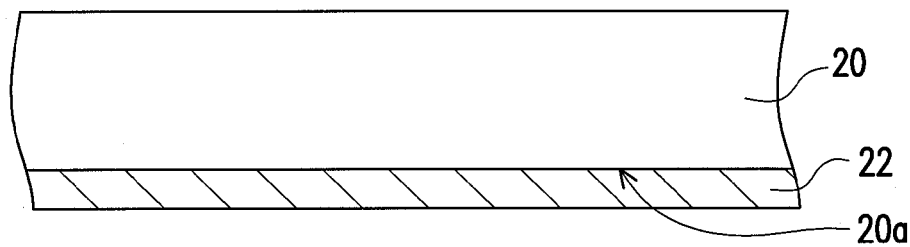
FIG. 1A to FIG. 1C are cross-sectional views illustrating a conventional method of fabricating a display panel.
Figure 1A:
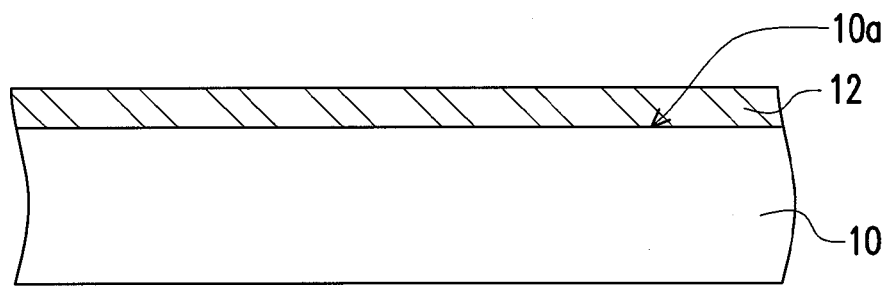
Figure 1B:
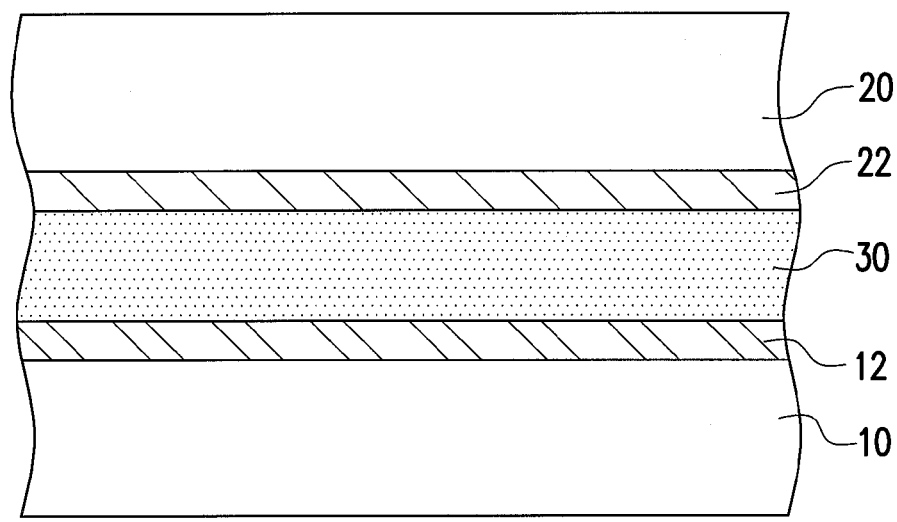
Figure 1C:
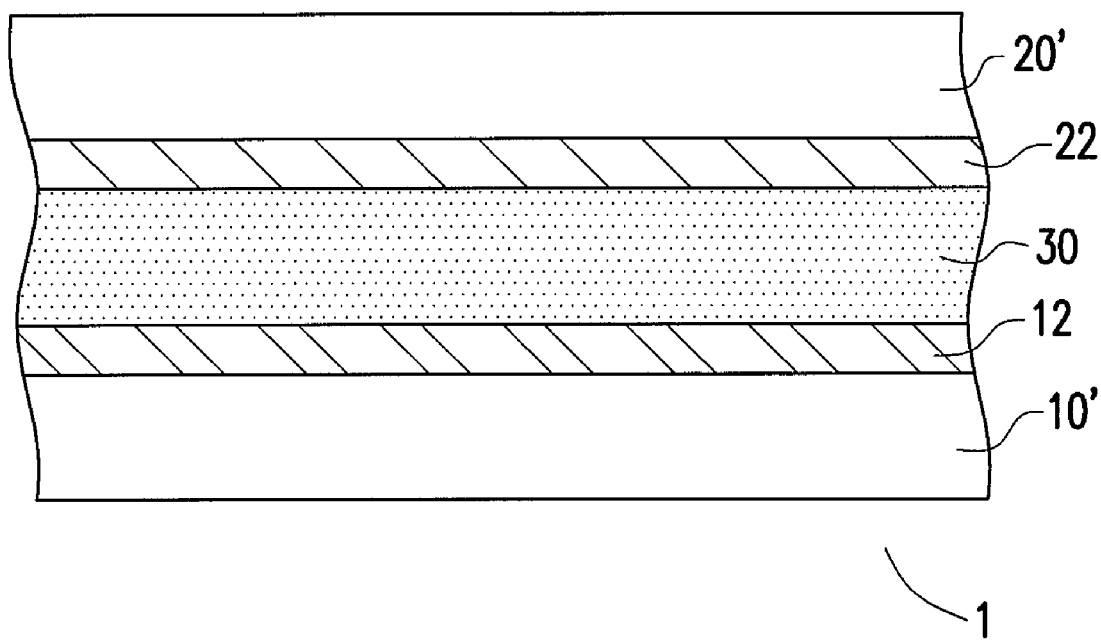

In brief, in the present embodiment, the first flexible substrate 110 and the second flexible substrate 120 are applied to serve as the substrates of the flexible display panel 100. Since the flexible substrate is bendable, the flexible display panel 100 can tolerate a specific degree of deformation. Compared to the conventional rigid glass substrates of the display panel 1 (referring to FIG. 1C), cracking of the flexible display panel 100 of the present embodiment due to pressure can be avoided, and a display (not shown) applying such display panel 100 may have a light and slim appearance.

The flexible display panel 100 can be fabricated according to a following method. In the following content, a structure of the flexible display panel 100 of FIG. 2 is taken as an example, and the method of fabricating the flexible display panel 100 is described in detail with reference of FIG. 3A to FIG. 3J.

Figure 3A:
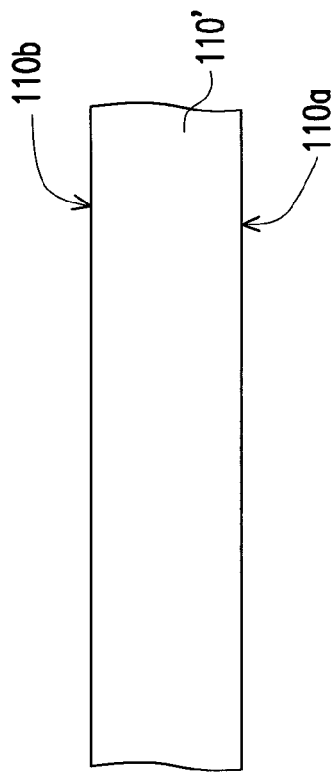
FIG. 3A to FIG. 3J are cross-sectional views illustrating a method of fabricating a flexible display panel of FIG. 2.
Figure 3A:
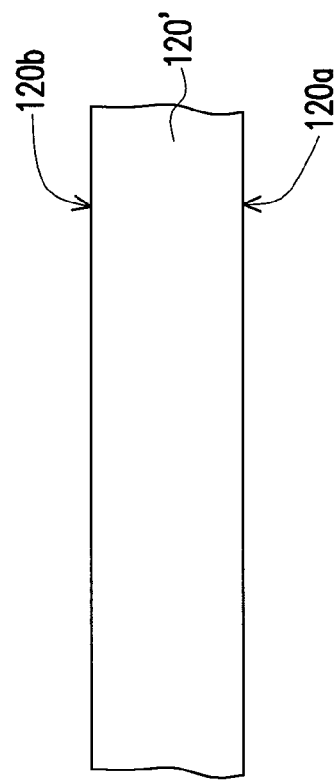

FIG. 3A to FIG. 3J are cross-sectional views illustrating a method of fabricating a flexible display panel of FIG. 2. Referring to FIG. 3A, the method of fabricating the flexible display panel 100 can be described as follows. First, a first glass substrate 110' and a second glass substrate 120' are provided, wherein the first glass substrate 110' has an inner surface 110a and an outer surface 110b, and the second glass substrate 120' has an inner surface 120a and an outer surface 120b.

Figure 3B:
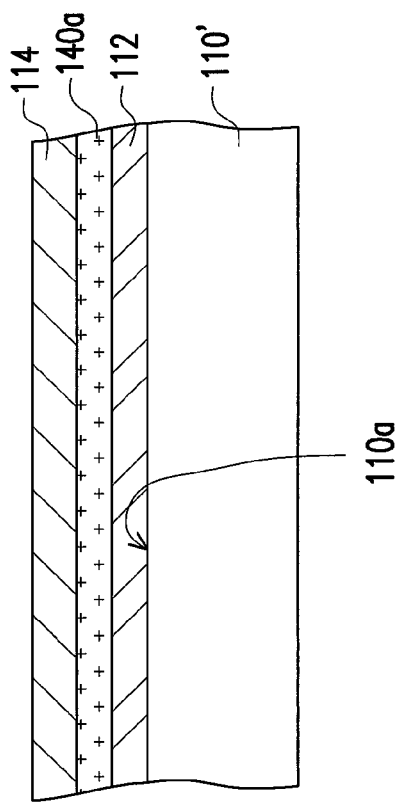
Figure 3B:
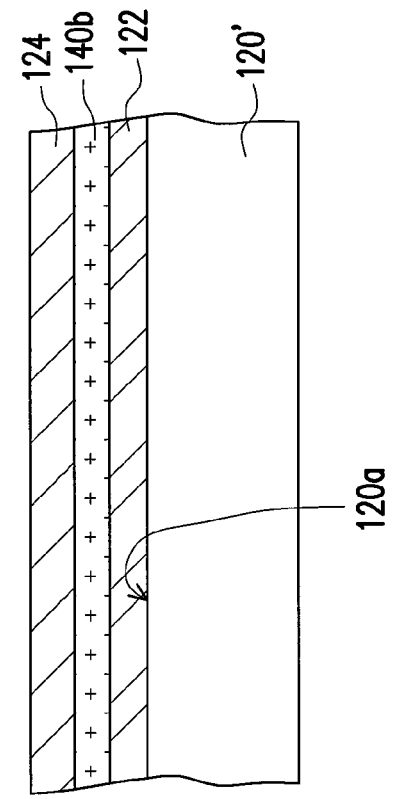

Referring to FIG. 3B, the first etching stop layer 112, the adhesive layer 140a and the active layer 114 are sequentially formed on the inner surface 110a of the first glass substrate 110', and the second etching stop layer 122, the adhesive layer 140b and the cover layer 124 are formed on the inner surface 120a of the second glass substrate 120', wherein the adhesive layers 140a and 140b can respectively increase the adhesion between the first etching stop layer 112 and the active layer 114 and the adhesion between the second etching stop layer 122 and the cover layer 124, and can respectively reduce the stress between the active layer 114 and the first etching stop layer 112 and the stress between the second etching stop layer 122 and the cover layer 124. It should be noted that in another embodiment, formation of at least one of the adhesive layers 140a and 140b can be omitted. Namely, none adhesive layer is disposed between the first etching stop layer 112 and the active layer 114 and between the second etching stop layer 122 and the cover layer 124, or the adhesive layer is selectively disposed between the first etching stop layer 112 and the active layer 114 or between the second etching stop layer 122 and the cover layer 124.

In detail, at least one of the materials of the first etching stop layer 112 and the second etching stop layer 122 includes silicon-rich dielectric material or polyamide, and structures of the first etching stop layer 112 and the second etching stoop layer 122 can be a single layer structure or a multi layer structure. For example, in the present embodiment, the materials of the first etching stop layer 112 and the second etching stop layer 122 are for example, the silicon-rich dielectric materials, and preferably the silicon-rich silicon nitride ($SixNy$), but the present invention is not limited thereto, wherein a proportion between silicon atoms and nitride atoms of the SixNy is substantially 1-1.25, but the present invention is not limited thereto, and the proportion between silicon atoms and nitride atoms of the SixNy is substantially greater than or equal to 1. In other embodiments, the silicon-rich dielectric material can be silicon-rich silicon oxide, silicon-rich silicon oxynitride, silicon-rich silicon carbide, silicon-rich silicon germanium, silicon-rich silicon arsenic, or other suitable materials, and definition of the silicon-rich is substantially the same to that of the silicon-rich silicon nitride. Moreover, the materials of the adhesive layers 140a and 140b, the active layer 114 and the cover layer 124 are the same to that described in the embodiment of FIG. 2, and the structures of the active layer 114 and the cover layer 124 are also the same to that described in the embodiment of FIG. 2, and therefore, detailed description thereof is not repeated.

Figure 3C:
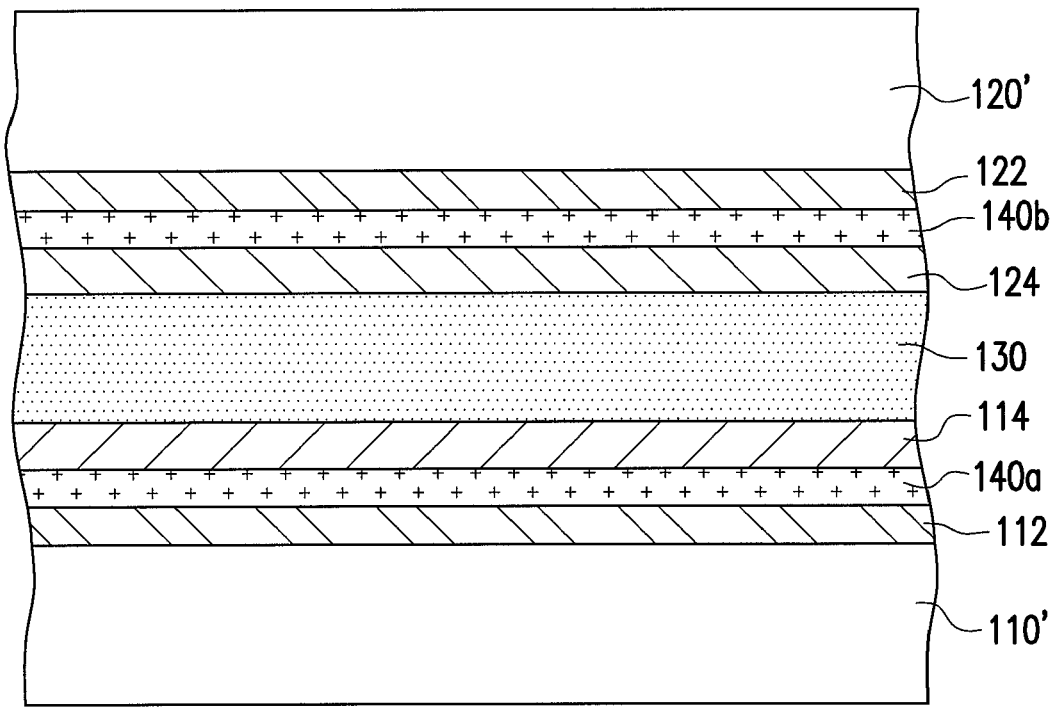

Referring to FIG. 3C, a display media 130 is formed between the first glass substrate 110' and the second glass substrate 120' and the first glass substrate 110' and the second glass substrate 120' are assembled. In the present embodiment, the display media 130 can be the self-luminescent material or the electroluminescent material, so that the material of the display media 130 is not limited by the present invention, and is just determined according to the type of the flexible display panel 100 (referring to FIG. 2). The display media 130 is as that described in the aforementioned content, and therefore detailed description thereof is not repeated.

Figure 3D:
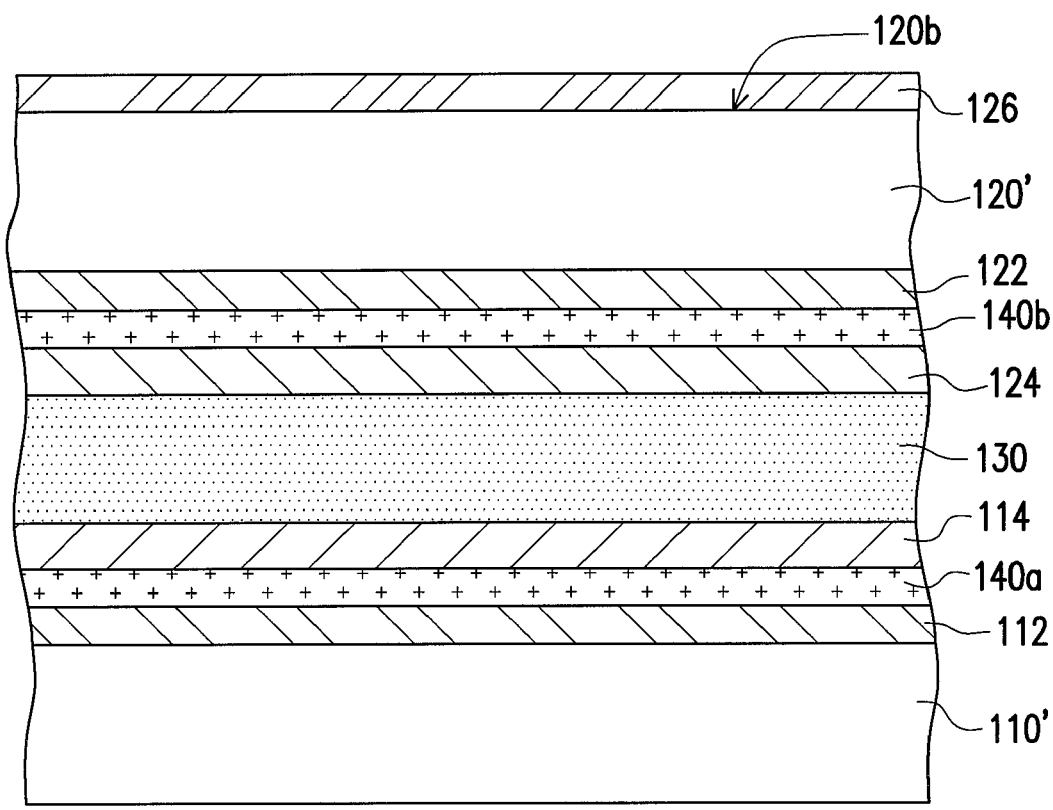
Figure 3E:
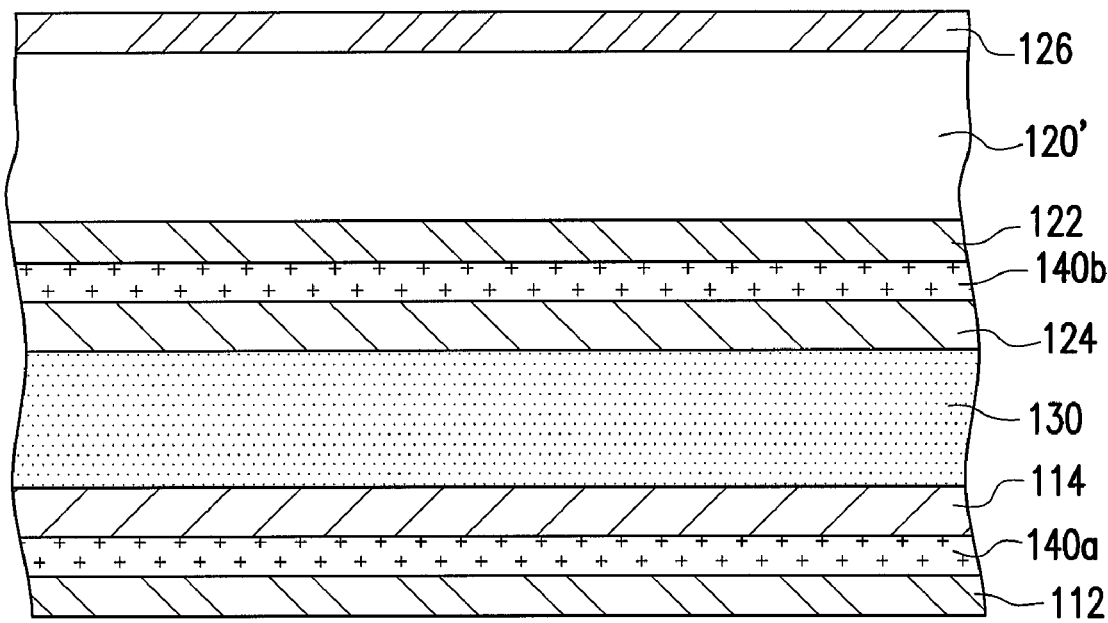

Referring to FIG. 3D, a first passivation layer 126 is formed on the outer surface 120b of the second glass substrate 120', wherein the structure of the first passivation layer 126 is the single layer structure or the multi layer structure, and the material thereof includes polyethylene, polypropylene, polycarbonate, polyethylene terephathalate, polyether, or other suitable materials or combinations thereof. Next, referring to FIG. 3E, a first etching process is performed to totally remove the first glass substrate 110' for exposing the first etching stop layer 112.

In detail, in the present embodiment, the first etching process is preferably performed under a room temperature below 26° C., and an etching rate of the first etching process is substantially 15-50 um/min for example, but the present embodiment is not limited to the temperature and/or the etching rate. During the first etching process, since the first passivation layer 126 is disposed on the outer surface 120b of the second glass substrate 120', the second glass substrate 120' does not directly touches the etching fluid, so as to avoid being eroded by the etching fluid. Since the first glass substrate 110' has no passivation layer, it is eroded by the etching fluid. When the etching fluid reaches the first etching stop layer 112, the etching fluid is stopped by the first etching stop layer 112, and now the first glass substrate 110' is totally removed by the etching fluid. Namely, the first glass substrate 110' is dissolved in the etching fluid, which is not that the first etching stop layer 112 is removed by the etching fluid for exfoliating the first glass substrate 110'.

Moreover, in the present embodiment, the first etching process is preferably multi etching steps including a first sub etching step and a second sub etching step, wherein etching rate of the first sub etching step is substantially greater than that of the second sub etching step. Namely, most of the first glass substrate 110' can be removed based on the first sub etching step having the relatively fast etching rate, and then the remained first glass substrate 110' is removed based on the sub second etching step having the relatively slow etching rate, so as to prevent the etching fluid excessively etching the etching stop layer 112. In other words, based on the two sub etching steps having different etching rates, an etching depth thereof can be accurately controlled. In another embodiment, only one sub etching step or another sub etching step can be performed between the first etching step and the second etching step, or can be performed after the second etching step, and the etching rate of the other sub etching step is determined according to an actual requirement. Preferably, if the other sub etching step is performed between the first etching step and the second etching step, the etching rate of the other sub etching step is between the etching rate of the first etching step and the etching rate of the second etching step. Alternatively, if the other sub etching step is performed after the second etching step, the etching rate of the other sub etching step is substantially less than the etching rate of the second etching step, but the present invention is not limited thereto. Moreover, the other sub etching step can also be divided into multi sub etching steps.

Moreover, an etching selectivity between the first etching stop layer 112 and the first glass substrate 110' is preferably 20-25, but the present invention is not limited thereto, and the etching selectivity between the first etching stop layer 112 and the first glass substrate 110' is substantially greater than or equal to 20. For example, if the material of the first etching stop layer 112 is the silicon-rich silicon nitride, when the first glass substrate 110' is etched by about 20 μm, the first etching stop layer 112 is only etched by about 1 μm. If the material of the first etching stop layer 112 is the polyamide, and when the first glass substrate 110' is etched by about 25 μm, the first etching stop layer 112 is only etched by about 1 μm.

Figure 3F:
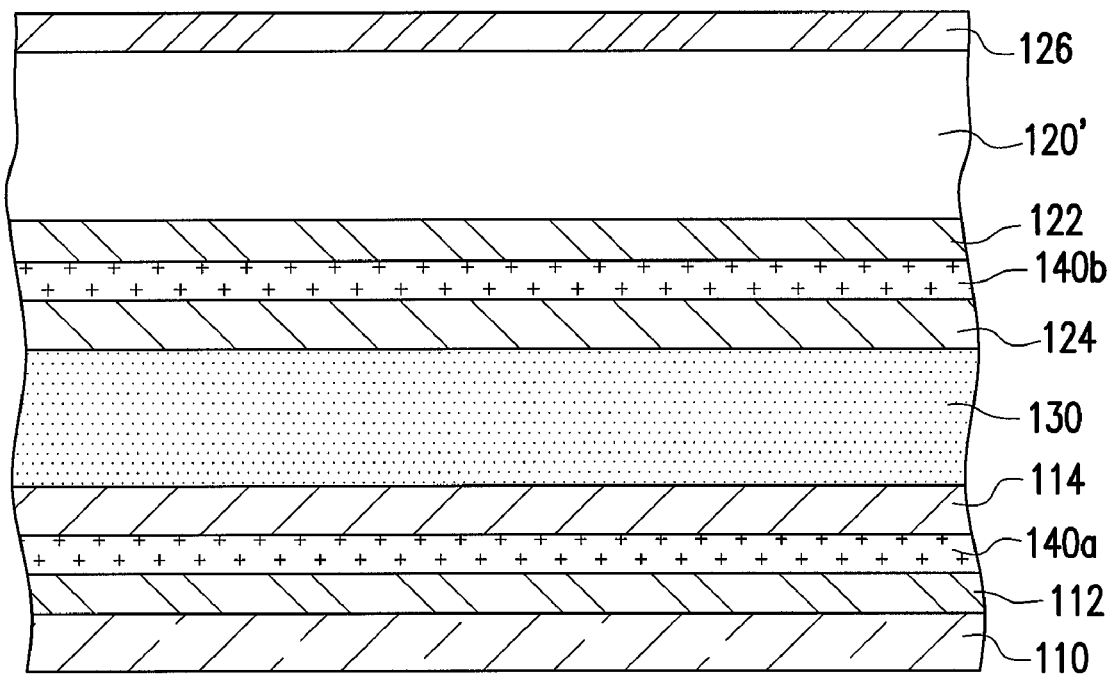
Figure 3G:
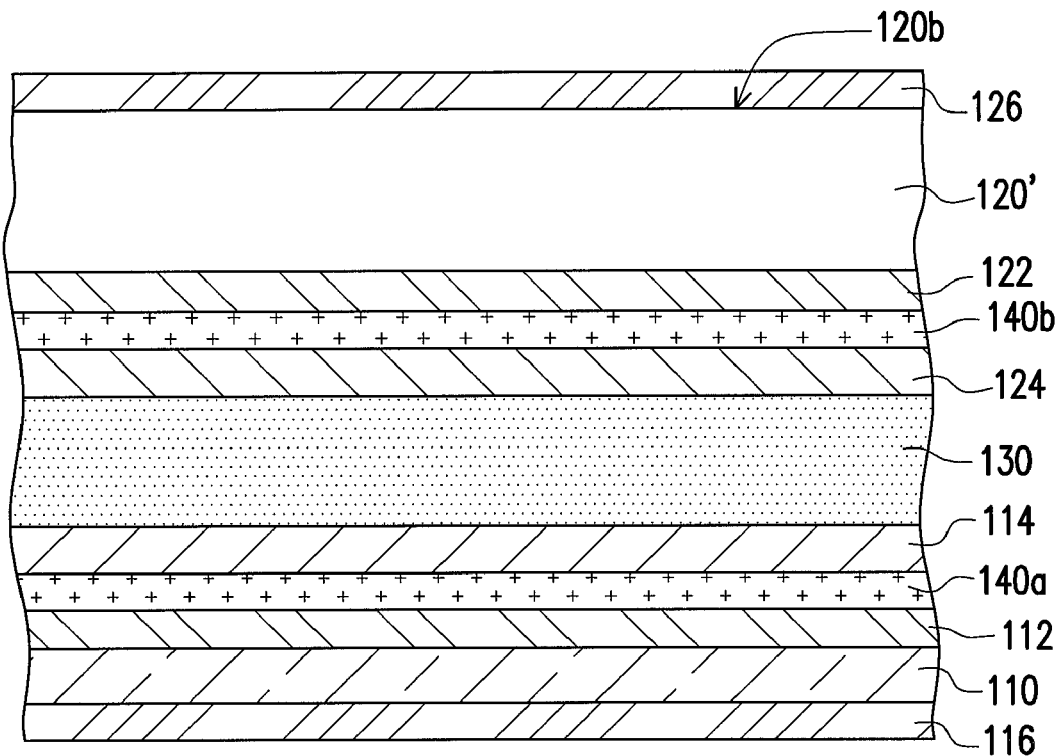

Referring to FIG. 3F and FIG. 3G, the first flexible substrate 110 is formed on the exposed first etching stop layer 112, and a second passivation layer 116 is formed on the flexible substrate 110, wherein a structure of the second passivation layer 116 is the single layer structure or the multi layer structure, and the material thereof includes polyethylene, polypropylene, polycarbonate, polyethylene terephathalate, polyether, or other suitable materials. Moreover, the material of the first flexible substrate 110 is as that described in the above paragraph (the paragraph corresponding to FIG. 2), and therefore detailed description thereof is not repeated.

Figure 3H:
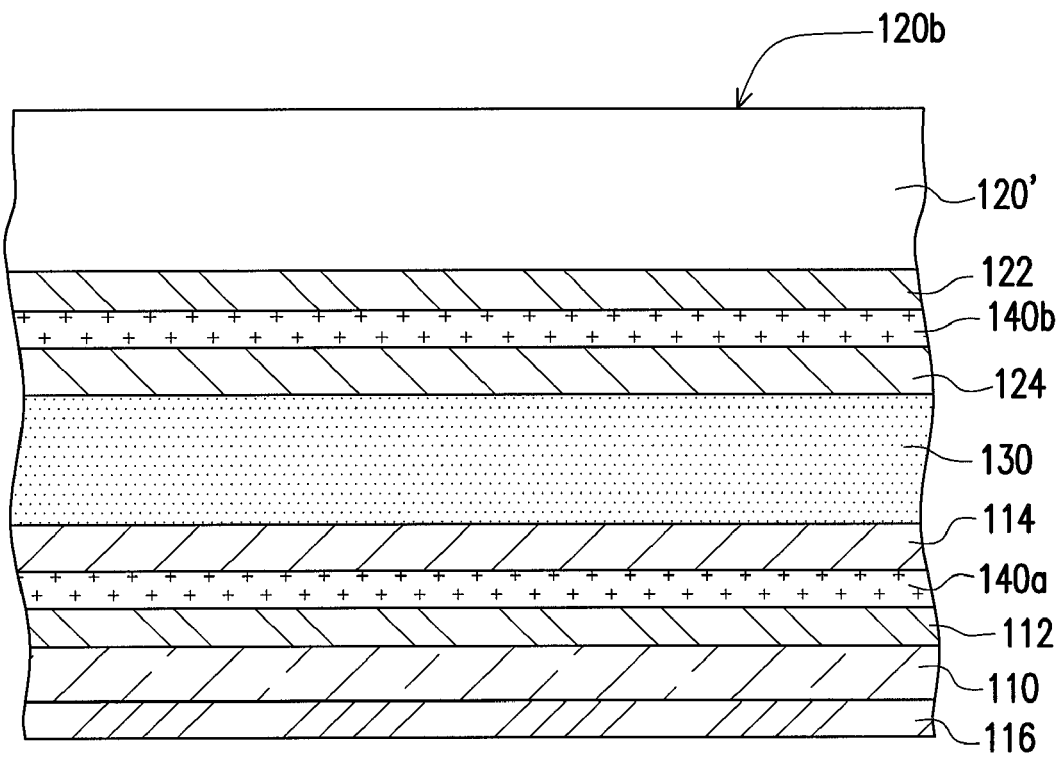
Figure 3I:
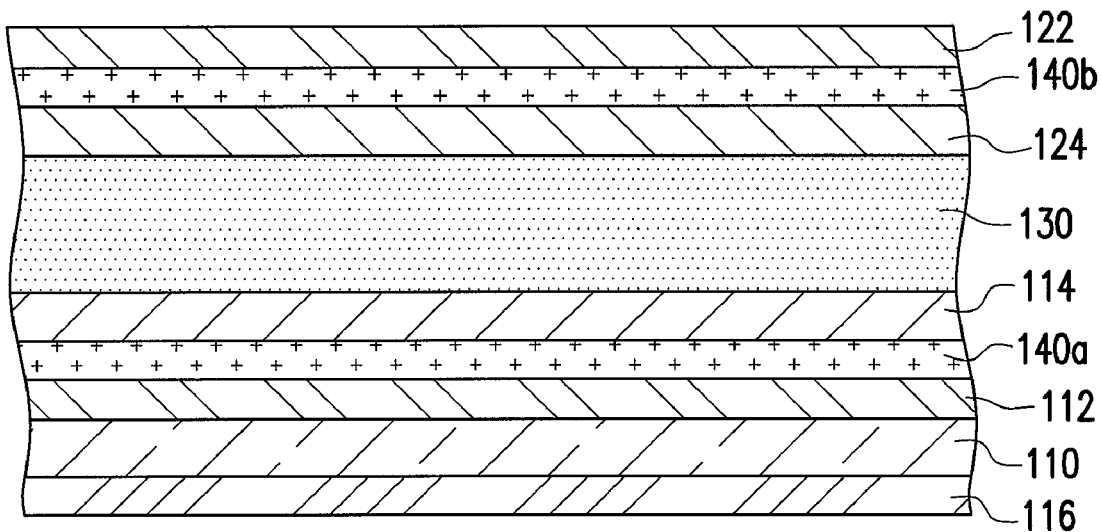

Referring to FIG. 3H, the first passivation layer 126 on the outer surface 120b of the second glass substrate 120' is removed to expose the second glass substrate 120'. Next, referring to FIG. 3I, a second etching process is performed to totally remove the second glass substrate 120' and expose the second etching stop layer 122.

In detail, the second etching process is preferably performed under a room temperature below 26° C., and an etching rate of the second etching process is substantially 15-50 um/min for example, but the present embodiment is not limited to the temperature and/or the etching rate. During the second etching process, since the second passivation layer 116 is disposed on the surface of the first flexible substrate 110, the first flexible substrate 110 does not directly touches the etching fluid, so as to avoid being eroded by the etching fluid. Since the outer surface 120b of the second glass substrate 120' is not protected by the passivation layer, it is eroded by the etching fluid. When the etching fluid reaches the second etching stop layer 122, the etching fluid is stopped by the second etching stop layer 122, and now the second glass substrate 120' is totally removed by the etching fluid. Namely, the second glass substrate 120' is dissolved in the etching fluid, which is not that the second etching stop layer 122 is removed by the etching fluid for exfoliating the second glass substrate 120'.

Moreover, in the present embodiment, the second etching process is preferably the multi etching steps including a first sub etching step and a second sub etching step, wherein etching rate of the first sub etching step is substantially greater than that of the second sub etching step. Namely, most of the second glass substrate 120' can be removed based on the first sub etching step having the relatively fast etching rate, and then the remained second glass substrate 120' is removed based on the second sub etching step having the relatively slow etching rate, so as to prevent the etching fluid excessively etching the etching stop layer 112. In other words, based on the two sub etching steps having different etching rates, an etching depth thereof can be accurately controlled. In another embodiment, only one sub etching step or another sub etching step can be performed between the first etching step and the second etching step, or can be performed after the second etching step, and the etching rate of the other sub etching step is determined according to an actual requirement. Preferably, if the other sub etching step is performed between the first etching step and the second etching step, the etching rate of the other sub etching step is between the etching rate of the first etching step and the etching rate of the second etching step. Alternatively, if the other sub etching step is performed after the second etching step, the etching rate of the other sub etching step is substantially less than the etching rate of the second etching step, but the present invention is not limited thereto. Moreover, the other sub etching step can also be divided into multi sub etching steps.

Moreover, an etching selectivity between the second etching stop layer 122 and the second glass substrate 120' is preferably 20-25, but the present invention is not limited thereto, and the etching selectivity between the second etching stop layer 122 and the second glass substrate 120' is substantially greater than or equal to 20. For example, if the material of the second etching stop layer 122 is the silicon-rich silicon nitride, when the second glass substrate 120' is etched by about 20 μm, the second etching stop layer 122 is only etched by about 1 μm. If the material of the first etching stop layer 112 is the polyamide, when the second glass substrate 120' is etched by about 25 μm, the second etching stop layer 122 is only etched by about 1 μm. Moreover, the etching selectivity between the first etching stop layer 112 and the first glass substrate 110' is substantially the same to that between the second etching stop layer 122 and the second glass substrate 120', but the present invention is not limited thereto, and the etching selectivity between the first etching stop layer 112 and the first glass substrate 110' can be substantially different to that between the second etching stop layer 122 and the second glass substrate 120'. Moreover, the number of steps for etching the first glass substrate 110' can be the same or different to the number of steps for etching the second glass substrate 120'.

It should be noted that in the present embodiment, the materials of the first etching stop layer 112 and the second etching stop layer 122 are preferably the silicon-rich silicon nitride (SixNy), but the present invention is not limited thereto. A proportion between silicon atoms and nitride atoms of the SixNy is substantially 1-1.25, but the present invention is not limited thereto, and the proportion between silicon atoms and nitride atoms of the SixNy is substantially greater than or equal to 1. The etching selectivity respectively between the first etching stop layer 112 and the first glass substrate 110' (referring to FIG. 3D) and between the second etching stop layer 122 and the second glass substrate 120' are substantially 20-25, but the present invention is not limited thereto, and the etching selectivity respectively between the first etching stop layer 112 and the first glass substrate 110' and between the second etching stop layer 122 and the second glass substrate 120' are substantially greater than or equal to 20.

TABLE 1

| Experiment condition | 1 | 2 | 3 | 4 |
|---|---|---|---|---|
| Flux of silicon-contained gas/flux of nitride-contained gas | 0.15 | 0.33 | 0.5 | 1 |
| Etching selectivity | 5.11 | 8.68 | 16.05 | 24.69 |

In detail, in the table 1, the etching selectivity respectively between the first etching stop layer 112 and the first glass substrate 110' (referring to FIG. 3D) and between the second etching stop layer 122 and the second glass substrate 120' are listed, and the experiment data of the flux of silicon-contained gas/the flux of nitride-contained gas of the silicon-rich silicon nitride used for generating the first etching stop layer 112 and the second etching stop layer 122. The silicon-contained gas includes silane, silicon ethane, di-silane, di-silane ethane, tetramethylsilane, or other suitable gases, or combinations thereof, and the nitride-contained gas includes nitrogen, ammonia, laughing gas, nitrous oxide, nitric oxide, nitrogen dioxide, or other suitable gases, or combinations thereof. In the present embodiment, the silicon-contained gas and the nitride-contained gas are respectively silane and ammonia, but the present invention is not limited thereto. According to the table one, when the flux of the silicon-contained gas/the flux of the nitride-contained gas of the silicon nitride used for generating the first etching stop layer 112 and the second etching stop layer 122 are respectively 1, 0.5, 0.33, and 0.15, the corresponding etching selectivity for the first glass substrate 110' and the second glass substrate 120' are about 25, 16, 9, and 5 respectively. Namely, the smaller the flux of the silicon-contained gas/the flux of the nitride-contained gas of the silicon nitride of the first etching stop layer 112 and the second etching stop layer 122 is, the smaller the corresponding etching selectivity for the first glass substrate 110' and the second glass substrate 120' is, and the weaker the capability for stopping the etching fluid is. Moreover, the etching fluid of the present embodiment includes hydrofluoric acid, acetic acid, hydrochloride acid, phosphatic acid, nitric acid, sulfuric acid, or other suitable etching fluid or combinations of at least two of the above acids. In the present embodiment, the etching fluid is hydrofluoric acid, but the present invention is not limited thereto.

Figure 3J:
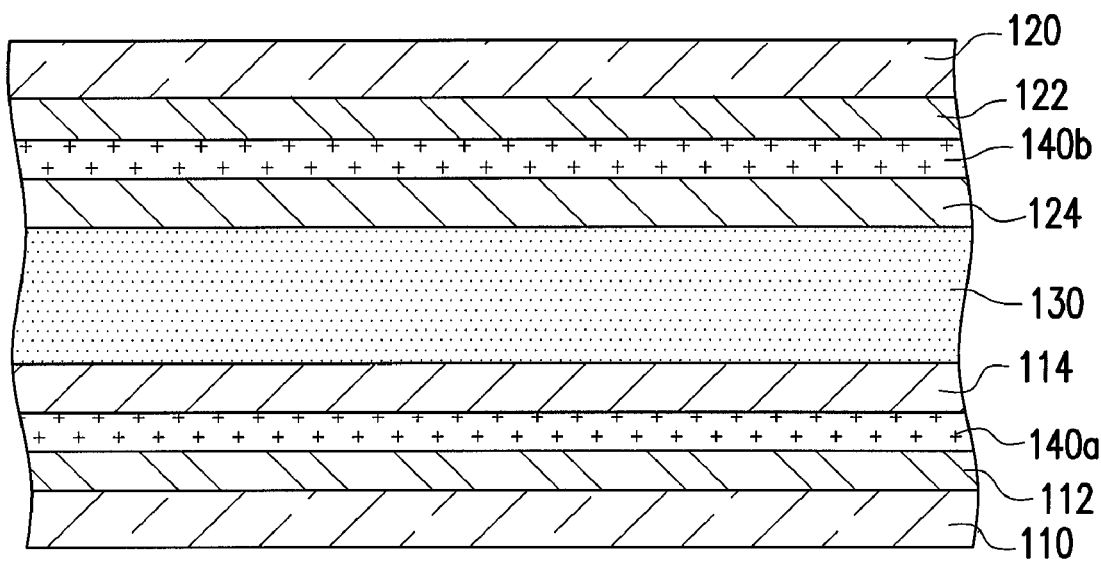

Referring to FIG. 3J, the second flexible substrate 120 is formed on the surface of the exposed second etching stop layer 122, and the second passivation layer 116 on the first flexible substrate 110 is removed, wherein the material of the second flexible substrate 110 is the same to that described in the embodiment of FIG. 2, so that detailed description thereof is not repeated. Now, fabricating of the flexible display panel 100 is approximately completed.

In brief, according to the fabricating method of the flexible display panel 100, the first glass substrate 110' and the second glass substrate 120' are assembled, and the display media 130 is formed between the first and second glass substrates 110' and 120', and then the first glass substrate 110' and the second glass substrate 120' are removed according to the first etching process and the second etching process, so as to form the first flexible substrate 110 and the second flexible substrate 120. Since the glass substrate belongs to the rigid substrate, poor alignment accuracy of the layers of the flexible display panel 100 can be avoided. Moreover, since the flexible substrate is bendable, the fabricated flexible display panel 100 can tolerate a certain degree of deformation. Compared to the conventional display panel 1 applying the rigid glass as the substrate, cracking of the flexible display panel 100 of the present embodiment due to pressure can be avoided, and a display (not shown) applying such display panel 100 may have a light and slim appearance.

Figure 4:
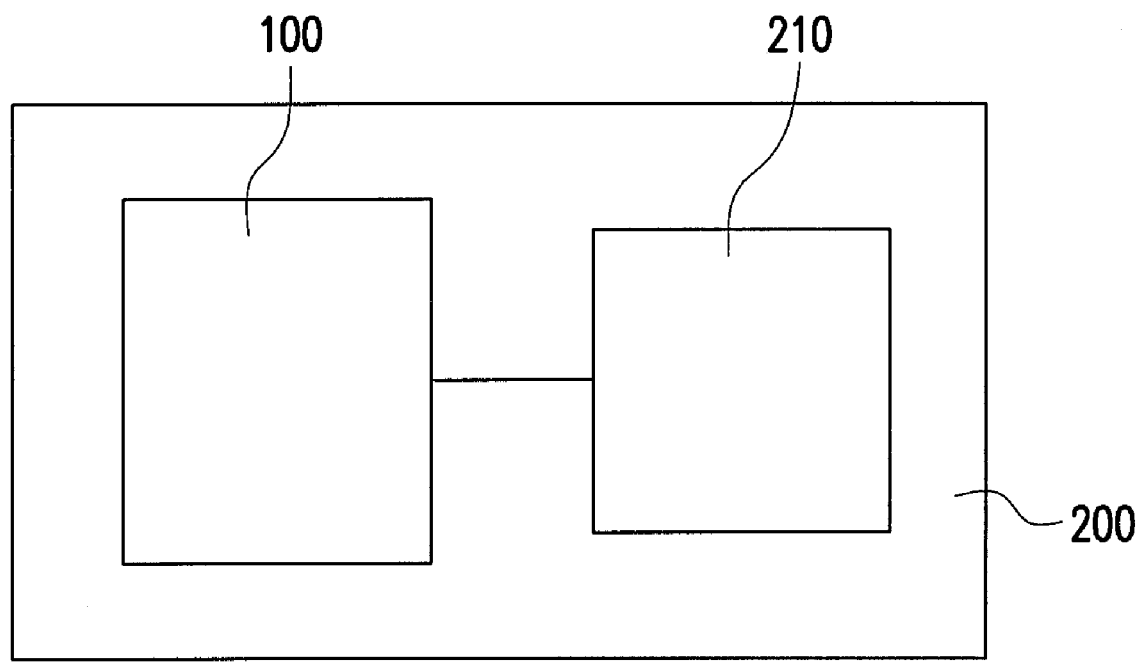
FIG. 4 is a schematic diagram illustrating an electro-optical device according to an embodiment of the present invention.

FIG. 4 is a schematic diagram illustrating an electro-optical device according to an embodiment of the present invention. Referring to FIG. 4, the flexible display panel 100 can be electrically connected to an electronic device to form the electro-optical device 200. A method of fabricating the electro-optical device 200 includes the method of fabricating the flexible display panel 100 and processes of fabricating various electro-optical devices 200, and by assembling the obtained display, the electro-optical device 200 is obtained. Since the flexible display panel 100 applies the flexible substrates as the substrates thereof, besides the feature of bendable, the electro-optical devices 200 applying the flexible display panel 100 also has advantages of light and slim.

Moreover, the electronic device 210 can be a control device, an operation device, a processing device, an input device, a memory device, a driving device, a luminescent device, a protection device, a sensing device, a detecting device, or other functional devices, or combinations thereof. The electro-optical device 200 can be a portable product (such as a mobile phone, a video camera, a camera, a laptop computer, a game machine, a watch, a music player, an e-mail transceiver, a map navigator, a digital picture, or other similar products), a video-audio product (such as a video-audio player or similar products), a screen, a television, a board, a panel within a projector, a panel within automated teller machine (ATM), or other suitable products.

In summary, since the flexible substrates are applied to serve as the substrates of the flexible display panel, the flexible display panel of the present invention can tolerate a certain degree of deformation. Compared to the conventional display panel applying the rigid glass as the substrate, cracking of the flexible display panel of the present embodiment due to pressure can be avoided, and the display applying such display panel may have a light and slim appearance. Moreover, the present invention also provides a method of fabricating the flexible display panel, by which the glass substrates are combined via the display media, and then the glass substrates are removed based on etching processes, so as to form the flexible substrates. Based on such fabricating method, the poor alignment accuracy problem can be avoided. Moreover, the electro-optical device applying such flexible display panel can also be bended, and has the light and slim appearance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a flexible display panel, comprising:
   providing a first glass substrate and a second glass substrate;
   sequentially forming a first etching stop layer and an active layer on an inner surface of the first glass substrate;

sequentially forming a second etching stop layer and a cover layer on an inner surface of the second glass substrate;

forming a display media between the first glass substrate and the second glass substrate and assembling the first glass substrate and the second glass substrate;

forming a first passivation layer on an outer surface of the second glass substrate;

performing a first etching process to totally remove the first glass substrate, so as to expose the first etching stop layer;

forming a first flexible substrate on the exposed first etching stop layer, and forming a second passivation layer on the first flexible substrate;

removing the first passivsation layer on the outer surface of the second glass substrate;

performing a second etching process to totally remove the second glass substrate, so as to expose the second etching stop layer; and forming a second flexible substrate on the exposed second etching stop layer, and removing the second passivation layer on the first flexible substrate.

2. The method for fabricating a flexible display panel of claim 1, wherein the material of at least one of the first etching stop layer and the second etching stop layer comprises a dielectric material or polyamide.

3. The method for fabricating a flexible display panel of claim 2, wherein the dielectric material is silicon-rich dielectric material.

4. The method for fabricating a flexible display panel of claim 3, wherein the silicon-rich dielectric material is silicon-rich silicon nitride, and a proportion between silicon atoms and nitride atoms of the silicon-rich silicon nitride is substantially greater than or equal to 1.

5. The method for fabricating a flexible display panel of claim 1, wherein an etching selectivity between the first etching stop layer and the first glass substrate and an etching selectivity between the second etching stop layer and the second glass substrate are substantially greater than or equal to 20.

6. The method for fabricating a flexible display panel of claim 1, wherein at least one of the first etching process and the second etching process comprises a first sub etching step and a second sub etching step, and an etching rate of the first sub etching step is substantially greater than that of the second sub etching step.

7. The method for fabricating a flexible display panel of claim 1, wherein the first flexible substrate and the second flexible substrate comprise plastic substrates, metal substrates, glass having curvatures, or combinations of at least two of the above substrates.

8. The method for fabricating a flexible display panel of claim 1, wherein at least one of the first flexible substrate and the second flexible substrate has functions of polarization, phase difference, brightness enhancement, light delay, or at least two of the above functions.

9. The method for fabricating a flexible display panel of claim 1, further comprising forming an adhesive layer at least one of between the first etching stop layer and the active layer and between the second etching stop layer and the cover layer.

10. A method for fabricating an electro-optical device, comprising the method for fabricating a flexible display panel of claim 1.

* * * * *